(12) United States Patent
Kim et al.

(10) Patent No.: US 9,012,992 B2
(45) Date of Patent: Apr. 21, 2015

(54) FABRICATION OF ELECTRONIC AND PHOTONIC SYSTEMS ON FLEXIBLE SUBSTRATES BY LAYER TRANSFER METHOD

(75) Inventors: Il-Doo Kim, Seoul (KR); Harry L. Tuller, Wellesley, MA (US); Yong Woo Choi, Seoul (KR); Akintunde I. Akinwande, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/534,094

(22) Filed: Jun. 27, 2012

(65) Prior Publication Data

US 2012/0273784 A1   Nov. 1, 2012

Related U.S. Application Data

(62) Division of application No. 11/221,325, filed on Sep. 7, 2005, now Pat. No. 8,232,182.

(60) Provisional application No. 60/607,686, filed on Sep. 7, 2004.

(51) Int. Cl.
*H01L 21/331* (2006.01)
*H01L 21/20* (2006.01)
*H01L 51/00* (2006.01)
*H01L 41/313* (2013.01)

(52) U.S. Cl.
CPC ........ *H01L 21/2007* (2013.01); *H01L 51/0013* (2013.01); *H01L 41/313* (2013.01)

(58) Field of Classification Search
USPC .......................................... 257/347
See application file for complete search history.

(56) References Cited

U.S. PATENT DOCUMENTS

| | | | |
|---|---|---|---|
| 6,242,152 | B1 | 6/2001 | Staral et al. |
| 6,420,242 | B1 | 7/2002 | Cheung et al. |
| 6,645,830 | B2 | 11/2003 | Shimoda et al. |
| 6,696,325 | B1 | 2/2004 | Tsai et al. |
| 2002/0146893 | A1 | 10/2002 | Shimoda et al. |
| 2003/0049560 | A1 | 3/2003 | Nirmal et al. |

FOREIGN PATENT DOCUMENTS

| | | |
|---|---|---|
| EP | 0795421 | 9/1997 |
| EP | 0858110 | 8/1998 |
| EP | 1548857 | 6/2005 |
| KR | 2003036405 | 5/2003 |

OTHER PUBLICATIONS

International Search Report issued in connection with PCT Application No. PCT/US2005/031666 mailed on Apr. 21, 2006.

*Primary Examiner* — Samuel Gebremariam
(74) *Attorney, Agent, or Firm* — Gesmer Updegrove LLP

(57) ABSTRACT

A transfer layer includes a transparent substrate. A buffer layer is formed on the transparent substrate that comprises PbO, GaN, PbTiO$_3$, La$_{0.5}$Sr$_{0.5}$CoO$_3$ (LSCO), or La$_x$Pb$_{1-x}$CoO$_3$ (LPCO) so that separation between the buffer layer and the transparent substrate occurs at substantially high temperatures.

8 Claims, 6 Drawing Sheets

FABRICATION OF ELECTRONIC AND PHOTONIC SYSTEMS ON FLEXIBLE SUBSTRATES BY LAYER TRANSFER METHOD

PRIORITY INFORMATION

This application is a divisional application of U.S. application Ser. No. 11/221,325, filed on Sep. 7, 2005 that claims priority from provisional application Ser. No. 60/607,686 filed Sep. 7, 2004, both of which are incorporated herein by reference in their entirety.

SPONSORSHIP INFORMATION

This invention was made with government support under Grant Numbers DAAD16-01-C-0026 and DAAD16-00-C-9279, awarded by the Army. The government has certain rights in the invention.

BACKGROUND OF THE INVENTION

The invention relates to the field of semiconductor devices, and in particular to the use of a layer transfer method in which the transfer layer is easily separated to make electronic devices onto plastic substrates.

Flexible substrates exhibit advantages of light weight and improved resistance to impact damage, making them suitable for portable devices. Further advantages include flexibility, bendability, foldability and extension to very large area substrates. Based on the concept to be described, a method is proposed to fabricate and integrate electronic and photonic devices on flexible substrates. There is a general interest to incorporate all types of active and passive electronic and photonic devices on the flexible substrates. The devices include transistor logic elements, memory devices, RF/Microwave devices including RF MEMS and field dependent dielectrics such as $(Ba,Sr)TiO_3$ films (antenna, resonators, filters, phase shifters and RLC components), micro-photonic devices (waveguide, electro-optic modulator, isolator, laser source etc.), optoelectronic (organic LED-light emitting diode: gate dielectric films can be transferred, injection laser, photodetector, etc.) sensor ($CaCu_3Ti_4O_{12}$ and ZnO for flexible gas sensor and switching devices) and actuators for MEMS applications, micropower sources for self-powered systems (Li ion battery, micro fuel cell, and solar cell).

SUMMARY OF THE INVENTION

According to one aspect of the invention, there is provided a transfer layer used for the formation of a semiconductor structure. The transfer layer includes a transparent substrate. A buffer layer is formed on the transparent substrate that comprises PbO, $PbTiO_3$, GaN, $La_{0.5}Sr_{0.5}CoO_3$ (LSCO) or $La_xPb_{1-x}CoO_3$ (LPCO) so that separation between the buffer layer and the transparent substrate occurs at substantially high temperatures.

According to another aspect of the invention, there is provided a method of forming a transfer layer used for the formation of a semiconductor structure. The method includes providing a transparent substrate. Also, the method includes forming a buffer layer that is formed on the transparent substrate that comprises PbO, $PbTiO_3$, GaN, $La_{0.5}Sr_{0.5}CoO_3$ (LSCO) or $La_xPb_{1-x}CoO_3$ (LPCO) so that separation between the buffer layer and the transparent substrate occurs at substantially high temperatures.

DETAILED DESCRIPTION OF THE INVENTION

A critical barrier towards realizing flexible systems normally associated with the fabrication of electronic and photonic devices is the high process temperatures. On the other hand, the fabrication and integration of the electronic and photonic devices on flexible substrates such as polymer, polyimide or polycarbonate is limited to low process temperature because the melting temperatures of flexible substrate are relatively low. In order to solve this problem, the use of a layer transfer method in which the transfer layer is durable at high temperature. Though other layer transfer methods such as ion slicing (smart cut) using H or He ion implantation are available, when applied to flexible substrates, the ion slicing process is also limited to low process temperature to avoid the explosive blistering of gases evolved from the substrate during fabrication. The present invention can be a unique solution for the fabrication of electronic and photonic systems on flexible substrates.

The invention utilizes room temperature grown PbO, GaN, $PbTiO_3$, $La_{0.5}Sr_{0.5}CoO_3$ (LSCO) and $La_xPb_{1-x}CoO_3$ (LPCO), which are formed with high vapor pressure of PbO as a transfer material for easy separation between an initial transparent substrate on which the electronic and photonic devices are fabricated.

Figure 1:
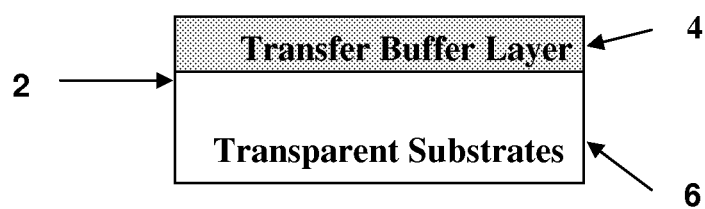
FIG. 1 is a schematic diagram illustrating the inventive transfer layer.

Formation of a transfer buffer layer 2 is shown in FIG. 1. The transfer buffer layer 2 includes a buffer layer 4 and a transparent substrate 6. The buffer layer 4 includes thin films of amorphous PbO, GaN, $PbTiO_3$, LSCO or LPCO. The films 4 are grown on any size transparent substrate 6 of fused quartz substrate and/or any kinds of transparent substrates such as MgO, $Al_2O_3$, $LaAlO_3$, YSZ, $MgAl_2O_4$ single crystals, or the like by physical (sputtering and pulsed laser deposition), evaporation, chemical method (CVD-chemical vapor deposition, ALD-atomic layer deposition, MBE-molecular beam epitaxy), and/or solution process (sol-gel).

The components 4, 6 of the transfer layer 2 is separated by irradiating a laser such as a KrF or XeCl excimer laser which can pass through the transparent substrate 6 and are absorbed by the buffer layer 4. Other materials can be used as a buffer layer 4. They include (Pb,Zr)$TiO_3$ series films like $PbTiO_3$, PLZT, PMN-PT, $LaNi_{1-x}Co_xO_3$ (LNO, LNCO), $SrRuO_3$.

Important things are that a transfer buffer layer can be in an amorphous phase. Therefore room temperature deposited transfer buffer layers have an advantage in terms of process cost. Amorphous PbO, $PbTiO_3$, GaN, which includes high volatile species, can be used as a buffer layer. The amorphous materials can be easily vaporized, and can be used for separation between a transparent substrate and an upper buffer layer when high temperature heat or energy is absorbed.

Figure 2:
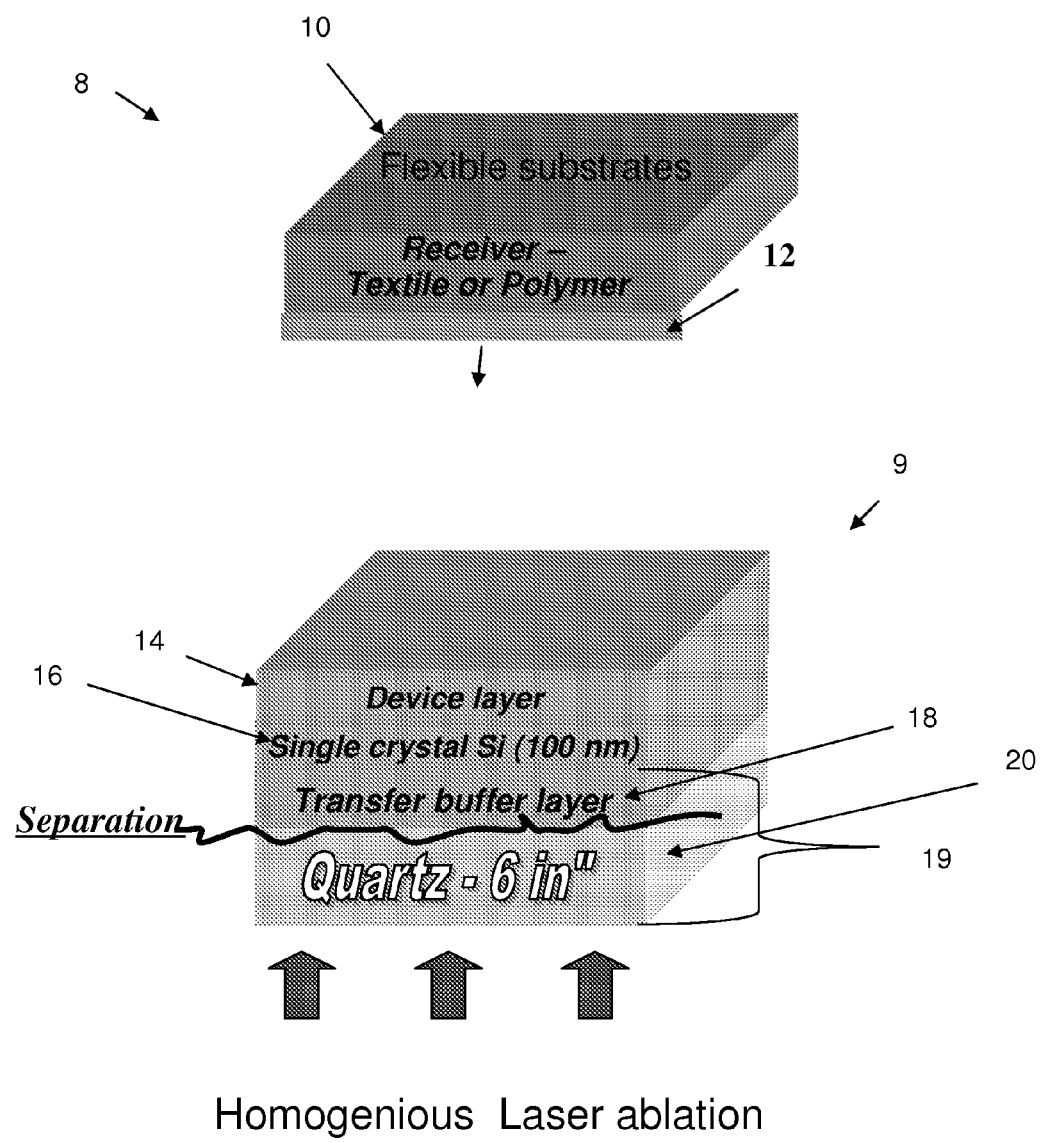
FIG. 2 is a schematic diagram illustrating the use of a transfer layer to form flexible electronic or photonic devices.

FIG. 2 illustrates the use of a transfer buffer layer to form flexible electronic or photonic devices which are based on Si substrates. There are essentially two components: the receiver portion 8 and device portion 9. The receiver portion 8 includes a flexible substrate 10 that comprises either textile or polymer materials and an adhesive 12 that couples to the device portion 9.

The device portion 9 includes a device layer 14, a thin single crystal Si layer 16, and a transfer layer 19. The device layer 14 comprises all types of active and passive electronic and photonic devices (transistors, digital and analog devices, memory devices, or the like), RF/Microwave devices (antenna, resonators, filters, phase shifters and RLC components, or the like), micro-photonic devices (waveguide, electro-optic modulator, isolator, laser source, or the like), optoelectronic devices, sensor and actuators for MEMS applications, micropower source for self-powered systems (Li ion battery, micro-fuel cell, and solar cell, or the like) that are fabricated on thin single crystalline Si layer 16.

The transfer layer 19 includes a transfer buffer layer 18 and a transparent substrate 20 and is formed according to the transfer layer 2 described in FIG. 1. The thin crystalline Si layer 16 is formed on the transfer layer 19. The top Si layer 16 can be formed by commercialized wafer bonding technique. Hydrogen is implanted into the single crystal Si wafer to a desired depth e.g., 100 nm, at which cleavage will be desired. The receiver transfer buffer layer 18 is bonded to the single crystal Si layer 16 through direct wafer bonding technology. By heat treatment, the bonded wafers are separated along hydrogen stopping regions, resulting in the transfer of a thin pure Si layer 16 on transfer buffer layer 18. The transfer layer 18 which includes a thin top Si layer 16 can be used for the various active and passive device fabrications.

Subsequently, the devices and systems are attached to a receiver system 8, and separated from the transparent substrate 20 by an irradiating laser, such as KrF, XeCl. If necessary, the transfer buffer layer 18 can be removed from either part or the entire area by patterning and etching process. Top Si layer 16 can be amorphous Si or poly Si layers depending on application.

Second approach is the direct growth of functional films onto a transfer buffer layer. In this case, the top Si layer is not necessary.

Figure 3:
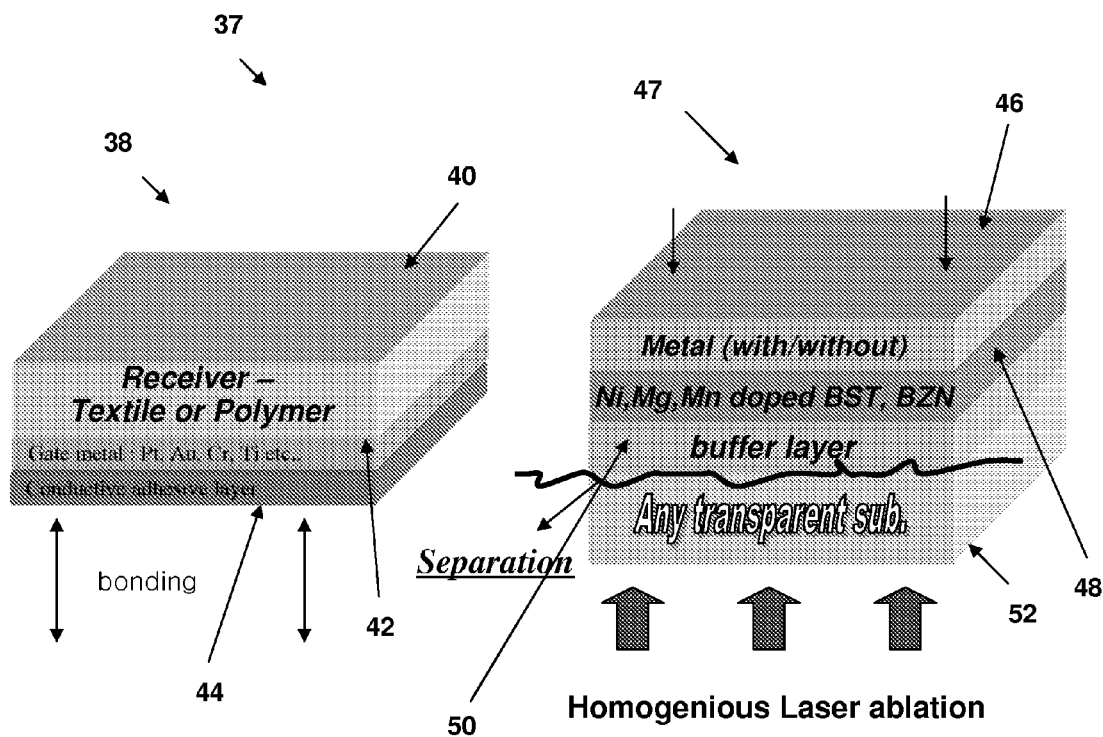
FIG. 3 is a schematic diagram illustrating the formation of an organic transistor.

FIG. 3 shows the formation of an organic transistor 37. The organic transistor 37 includes a first structure 38 that includes a conductive adhesive layer 44, a gate metal 42 that is formed on the adhesive layer 44, and a receiver layer 40 that is formed on the gate metal 42. The receiver layer 40 can be comprised of a polymer or textile. The gate metal 42 can be comprised of Pt, Au, Cr, Ti, or the like. The structure 38 can be bonded unto another structure 47 that includes a transparent substrate 52, a transfer buffer layer 50 that is formed on the transparent substrate 52, and gate dielectric layers 48 is formed on the transfer buffer layer 50 at elevated temperature which can give well crystallized structure for best performance, and a metal layer 46 is formed on the gate dielectric layers 48. The gate dielectric layers 48 can be Mg, Ni, Mn doped (Ba,Sr)TiO$_3$, Bi$_{1.5}$Zn$_{1.0}$Nb$_{1.5}$O$_7$, HfO$_2$, or the like. Note the transparent substrate 52 has been ablated with a laser to form a flexible substrate. The metal layer 46 is comprised of Pt, Au, Cr, Ti, or the like, and is optional. The formation of the transfer layer 50 is similar the transfer layer 4 discussed in FIG. 1.

Figure 4:
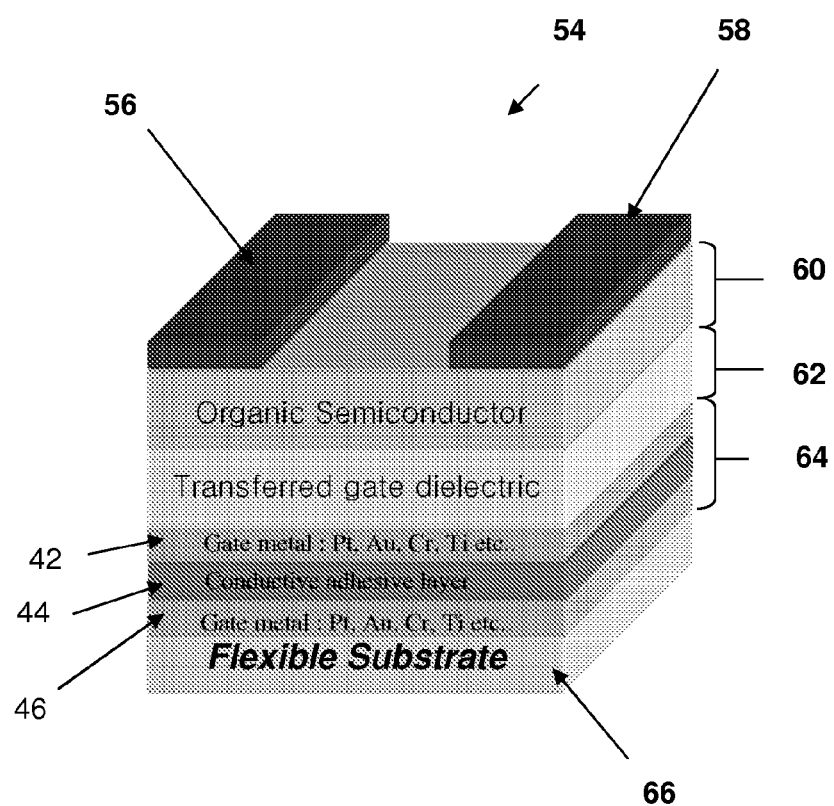
FIG. 4 is a schematic block diagram illustrating the fabrication of a second embodiment of an organic transistor formed in accordance of the invention.

FIG. 4 shows the fabrication of a transistor 54. The transistor 54 includes an organic or inorganic semiconductor 60, gate dielectric 62, and gate metal 64. After the bonding of the structures 38 and 47 of FIG. 3, the formation of the gate dielectric 62 includes the receiver layer 40 of structure 38. The gate metal 64 includes the gate metal layer 42 and adhesive layer 44 of structure 38 and the metal layer 46 of the structure 47. The source 56 and drain 58 of the transistor is formed on the organic semiconductor 60.

This technique enables one to prepare the desired inorganic dielectrics at elevated temperatures thereby reaching even higher dielectric constants and low leakage current density. The inorganic dielectric is then subsequently combined with the polymer layers at or near room temperature thereby protecting the stability of the organic transistor structure.

As an extension concept of second approach, other functional thin films can be deposited at elevated temperature on transfer buffer layer/transparent substrate system. In case, high temperature grown transfer buffer layer which has crystalline structure is preferred for the high quality functional thin film growth.

Ferroelectric and piezoelectric films, such as (Pb,Zr)TiO$_3$ (PZT), BaTiO$_3$ (BT), (Ba,Sr)TiO$_3$ (BST), are used as sensors and actuators for MEMS applications, capacitors for FRAM applications, waveguides and optical components for photonics applications, and tunable devices for microwave device applications. If polymers could be used as substrate, one could make the micro-systems flexible, bendable, foldable, wearable and very large.

The ferro/piezo-electric films are typically formed at high temperature (500~900° C.). Flexible polymers, such as polyimide or polycarbonate, cannot tolerate high-temperature processing. One way to deposit ferro/piezo-electric films on flexible substrates is to prepare the ferro/piezo-electric films on rigid substrates, which are heat-durable and UV-transparent, and then transfer the ferro/piezo-electric films to the flexible substrate using the laser liftoff (LLO) method. LLO is accomplished by irradiating the film/substrate interface with UV light from an excimer laser, such as KrF. Absorption of the laser energy results in localized heating and subsequent liftoff of the film from the original substrate.

However, this process causes damage to the newly formed layers, which degrades the performance of the devices based on the layers. One alternative that avoids this problem is to form a buffer layer between the ferro/piezo-electric film and the substrate and transfer the buffer layer plus the ferro/piezo-electric films. The ferro/piezo-electric film will thus not be damaged resulting in no degradation of properties. Choosing a suitable material such as La$_{0.5}$Sr$_{0.5}$CoO$_3$ (LSCO) as a buffer layer, one can improve the dielectric properties of the ferro/piezo-electric films. The other buffer layers can include crystalline PbO, GaN, PbTiO$_3$, La$_x$Pb$_{1-x}$CoO$_3$ (LPCO). This method has advantages for making high quality ferro/piezo-electric films on flexible substrates, leading to foldable, wearable, and very large micro-systems.

Figure 5A:
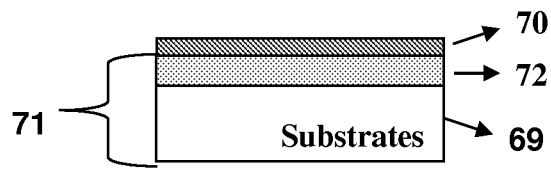
FIGS. 5A-5D are schematic diagrams illustrating the methodology of forming ferro/piezo-electric films using the invention.
Figure 5B:
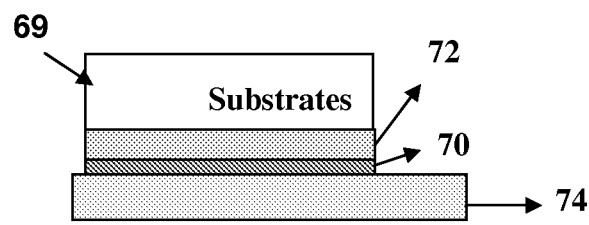
Figure 5C:
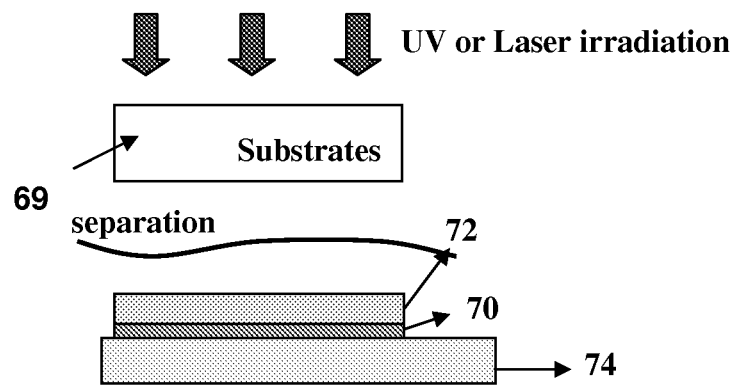
Figure 5D:
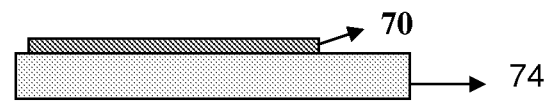

FIGS. 5A-5D are schematic diagrams illustrating the methodology of forming ferro/piezo-electric films using the invention. FIG. 5A shows a high quality ferro/piezo-electric film 70 that is formed on a transfer layer 71 that includes a LSCO buffer layer 72 grown on a substrate 69 such as single crystals and/or fused quartz using physical methods, such as sputtering, PLD or chemical methods, such as CVD, ALD, or sol-gel. Note the transfer layer is formed in a similar fashion of the transfer layer of FIG. 1. FIG. 5B shows the top piezo-electric/ferroelectric film 70 being attached to a flexible substrate 74, such as polyimide, polycarbonate, PET with an adhesive that could be conductive. FIG. 5C shows the piezo-electric/ferroelectric film 70 being transferred from the original substrate to the flexible substrate 74. The transparent substrate 69 forming part of the transfer layer 71 is removed via UV irradiation from an excimer laser, such as KrF. FIG. 5D shows the buffer layer 72 being removed from either part or the entire area by patterning. The buffer layer 72 can be used as an electrode for the device.

Although the present invention has been shown and described with respect to several preferred embodiments thereof, various changes, omissions and additions to the form and detail thereof, may be made therein, without departing from the spirit and scope of the invention.

What is claimed is:

1. A transfer layer used for the formation of a semiconductor structure comprising:
    a transparent substrate; and
    a transfer buffer layer that is formed directly on said transparent substrate that includes thin film layers of $La_{0.5}Sr_{0.5}CoO_3$ (LSCO) grown at room temperature, said transfer buffer layer includes a device layer wherein one or more semiconductor device structures are formed on said device layer, said one or more semiconductor device structures include active and passive components, said one or more semiconductor device structures are coupled to a receiver structure, wherein an irradiating light source separates said transfer buffer layer directly from said transparent substrate, said irradiating light source irradiates light energy that passes through said transparent substrate and is directly absorbed by the transfer buffer layer after passing through said transparent substrate.

2. The transfer layer of claim 1, wherein said transfer buffer layer include top thin single crystalline Si layer formed by wafer bonding technique or thin amorphous Si/poly Si layer.

3. The transfer layer of claim 1, wherein said transfer buffer layer is formed using chemical vapor deposition, atomic layer deposition, molecular beam epitaxy, sputtering, pulsed laser deposition, or solution process (sol-gel).

4. The transfer layer of claim 1, wherein said transparent substrate comprises MgO, $Al_2O_3$, $LaAlO_3$, YSZ, $MgAl_2O_4$, fused quartz, or glass.

5. The transfer layer of claim 1, wherein said semiconductor structure comprises an organic transistor.

6. The transfer layer of claim 1, wherein said semiconductor structure comprises a flexible semiconductor structure.

7. The transfer layer of claim 1, wherein said semiconductor structure comprises a transistor.

8. The transfer layer of claim 1 further comprising a ferroelectric or piezoelectric film layer that is formed on said transfer buffer layer.

* * * * *